United States Patent
Gagnon et al.

(10) Patent No.: US 10,191,095 B2
(45) Date of Patent: Jan. 29, 2019

(54) WIRELESS SENSOR NETWORK FOR MEASUREMENT OF ELECTRICAL ENERGY CONSUMPTION

(71) Applicant: SOCOVAR S.E.C., Montréal (CA)

(72) Inventors: Ghyslain Gagnon, Longueuil (CA); Sebastien Jomphe, Montreal (CA); Daniel Sicard, St-Eustache (CA); Michel Dallaire, Montreal (CA); Dominic Arbour, Montreal (CA)

(73) Assignee: SOCOVAR S.E.C., Montreal (CA)

( * ) Notice: Subject to any disclaimer, the term of this patent is extended or adjusted under 35 U.S.C. 154(b) by 0 days.

(21) Appl. No.: 14/396,928

(22) PCT Filed: Apr. 29, 2013

(86) PCT No.: PCT/CA2013/050326
§ 371 (c)(1),
(2) Date: Oct. 24, 2014

(87) PCT Pub. No.: WO2013/159235
PCT Pub. Date: Oct. 31, 2013

(65) Prior Publication Data
US 2015/0123654 A1    May 7, 2015

Related U.S. Application Data

(60) Provisional application No. 61/639,355, filed on Apr. 27, 2012.

(51) Int. Cl.
*G01R 21/133* (2006.01)
*G01R 21/08* (2006.01)
(Continued)

(52) U.S. Cl.
CPC .......... *G01R 21/08* (2013.01); *G01R 21/133* (2013.01); *H04L 12/2823* (2013.01); *G01R 1/04* (2013.01);
(Continued)

(58) Field of Classification Search
CPC ... G01R 21/133; G01R 21/08; H02J 13/0075; H04L 12/2823
(Continued)

(56) References Cited

U.S. PATENT DOCUMENTS 5,604,476 A * 2/1997 Schmidt ................. H01H 61/02
337/100
6,414,474 B1 * 7/2002 Gohara ................. G01R 15/207
324/117 H (Continued)

OTHER PUBLICATIONS

The Climate Group, "SMART 2020 Report," 2008. [Online]. Available: http://www.smart2020.org/_assets/files/02_Smart2020Report.pdf. [Accessed Dec. 22, 2011].
(Continued)

*Primary Examiner* — Son Le
*Assistant Examiner* — Akm Zakaria
(74) *Attorney, Agent, or Firm* — Norton Rose Fulbright Canada LLP

(57) ABSTRACT

There is described a system to measure the electrical consumption of a household. This system consists of a network of measuring devices that are attached to wires between electrical appliances and circuit breakers and of a communication and processing unit that receives measurement data from the measuring devices. Low precision sensors based on the Hall effect may be used for obtaining precise measurements of energy consumption by providing a casing for the measuring devices that ensures a fixed, known, and precise alignment with respect to the wire to which it is attached.

(Continued)

Low precision sensors based on the Hall effect may also be used by performing a correction calibration of measured data.

22 Claims, 16 Drawing Sheets

(51) Int. Cl.
  *H04L 12/28* (2006.01)
  *G01R 1/04* (2006.01)
  *G01R 1/18* (2006.01)
  *G01R 35/00* (2006.01)
  *G01R 15/20* (2006.01)
  *H04L 29/08* (2006.01)
  *H02J 13/00* (2006.01)

(52) U.S. Cl.
  CPC .............. *G01R 1/18* (2013.01); *G01R 15/202* (2013.01); *G01R 35/005* (2013.01); *H02J 13/0075* (2013.01); *H04L 67/12* (2013.01); *H04L 2012/285* (2013.01); *H04L 2012/2841* (2013.01); *Y02B 70/325* (2013.01); *Y02B 70/3266* (2013.01); *Y02B 90/2653* (2013.01); *Y04S 20/228* (2013.01); *Y04S 20/242* (2013.01); *Y04S 40/126* (2013.01)

(58) Field of Classification Search
  USPC ......................................................... 324/251
  See application file for complete search history.

(56) References Cited

U.S. PATENT DOCUMENTS

| | | | | |
|---|---|---|---|---|
| 2009/0206059 | A1* | 8/2009 | Kiko | H02J 3/14 218/143 |
| 2010/0070217 | A1* | 3/2010 | Shimada | G01D 4/008 702/62 |
| 2011/0032070 | A1* | 2/2011 | Bleile | H05B 37/0272 340/3.51 |
| 2011/0037455 | A1* | 2/2011 | Oren | G01D 4/004 324/103 R |
| 2011/0074382 | A1* | 3/2011 | Patel | G01R 15/207 324/76.11 |
| 2011/0187348 | A1* | 8/2011 | Soneda | H01R 25/003 324/117 H |
| 2012/0001617 | A1* | 1/2012 | Reynolds | G01R 15/18 324/74 |
| 2012/0203481 | A1* | 8/2012 | Carpenter | G01R 21/133 702/62 |
| 2013/0211754 | A1* | 8/2013 | Herzog | G01R 22/063 702/62 |
| 2015/0316594 | A1* | 11/2015 | Kania | G01R 31/327 702/62 |

OTHER PUBLICATIONS

S. Darby, "The Effectiveness of Feedback on Energy Consumption," Apr. 2006. [Online]. Available: http://www.eci.ox.ac.uk/research/energy/downloads/smart-metering-report.pdf. [Accessed Jan. 13, 2012].

IEEE Computer Society, "IEEE Std 802.15.4 ™-2003," 2003. [Online]. Available: http://standards.ieee.org/getieee802/download/802.15.4-2003.pdf. [Accessed Dec. 21, 2011].

E. Ramsden, Hall-Effet Sensors, 2nd ed., Chapter 7, Oxford: Elsevier, 2006.

PowerHouse Dynamics eMonitor. [Online]. Available: http://bit.ly/oeSnxD [Accessed Aug. 31, 2017].

Crestron Green Light Power Meter. [Online]. Available: http://bit.ly/zbykus [Accessed Aug. 31, 2017].

Savant Energy Management. [Online]. Available: https://savantsystems.force.com/Customers/apex/SavEC_CategoryLanding?id=a3g700000008R89AAE [Accessed Aug. 31, 2017].

Intelligy. [Online]. Available: http://bit.ly/x0uR12 [Accessed Aug. 31, 2017].

* cited by examiner

WIRELESS SENSOR NETWORK FOR MEASUREMENT OF ELECTRICAL ENERGY CONSUMPTION

CROSS-REFERENCE TO RELATED APPLICATIONS

This application claims priority under 35 U.S.C. 119(e) of U.S. Provisional Patent Application No. 61/639,355, filed on Apr. 27, 2012, the contents of which are hereby incorporated.

TECHNICAL FIELD

The present invention relates to the field of wireless sensors for residential electrical energy consumption measurements, and more particularly, to the use of low precision sensors based on the Hall effect.

BACKGROUND OF THE ART

By providing better information to users regarding energy consumption, better decisions may be made to assist in energy consumption reduction. There are already many products available on the market to measure the energy consumption of a residential environment. For example, The Energy Detective (TED) measures the total electricity consumption and provides real-time kW/hr readings, load profiles for up to 5 appliances, monthly bill projections, voltage and power factor. A current clamp is connected to the main electricity cable and measures the total consumption of the residence. The user can also buy individual appliance monitors to monitor particular appliances. These sensors are inserted between the wall outlets and the appliances' cord and may communicate together.

Some of the challenges of such systems is the desire to strike a balance between the complexity of the system, the costs, and the precision. Reduced complexity will lead to lower costs, but will also lead to lower precision. Without the proper precision, the information provided loses its value. Most existing systems use high precision sensors such as current transformers.

Therefore, there is a need to improve existing systems for measuring energy consumption in various environments.

SUMMARY

There is described a system to measure the electrical consumption of a household. This system consists of a network of measuring devices that are attached to wires between electrical appliances and circuit breakers and of a communication and processing unit that receives measurement data from the measuring devices. Low precision sensors based on the Hall effect may be used for obtaining precise measurements of energy consumption by providing a casing for the measuring devices that ensures a fixed, known, and precise alignment with respect to the wire to which it is attached. Low precision sensors based on the Hall effect may also be used by performing a correction calibration of measured data.

In accordance with a first broad aspect, there is provided a system for measuring electricity consumption of an environment having a plurality of electrical appliances. The system comprises a plurality of measuring devices for connection to a wire between one of the plurality of electrical appliances and one of a plurality of corresponding circuit breakers. Each one of the measuring devices comprises a Hall effect sensor configured to measure a current flowing through the wire; and a casing defining an enclosure for receiving the Hall effect sensor and comprising an attachment member for engaging with the wire and fixing a position of the Hall effect sensor with respect to the wire to a known relative position. The system also comprises a communication and processing unit in wireless communication with the measuring devices and configured for receiving individual consumption measurement data representative of the electricity consumption of the plurality of electrical appliances.

In accordance with a second broad aspect, there is provided a measuring device for measuring individual electricity consumption of electrical appliances comprising: a Hall effect sensor configured to measure a current flowing through a wire connected between the individual appliance and a circuit a casing defining an enclosure for receiving the Hall effect sensor and comprising an attachment member for engaging with the wire and fixing a position of the Hall effect sensor with respect to the wire to a known relative position.

In accordance with another broad aspect, there is provided a method for measuring electricity consumption of an individual electrical appliance. A low precision sensor operating on a Hall effect is attached to a wire connected between the individual electrical appliance and a circuit breaker. The low precision sensor is aligned with the wire and positioned at a known and fixed position with respect to the wire. Current flowing through the wire is measured using the low precision sensor and the measured current is processed using the known and fixed position of the low precision sensor with respect to the wire to increase precision of the measured current.

In accordance with yet another broad aspect, there is provided a method for measuring electricity consumption of a set of individual electrical appliances. The method comprises attaching low precision sensors operating on a Hall effect to wires connected between each one of the individual electrical appliances and a corresponding circuit breaker. Currents flowing through the wires are measured using the low precision sensors. Each current measured from the low precision sensors is automatically calibrated to correct an error and improve precision.

In this specification, the term "microcontroller" should be understood to mean a microcomputer, microprocessor, or other equipment used for precise process control in data handling and communication. While the embodiments of the invention are described on the basis of a microcontroller being a single chip that contains a processor (the CPU), non-volatile memory for the program (ROM or flash), volatile memory for input and output (RAM), a clock and an I/O control unit, more than one chip may be used to provide the required functions. While the present description refers to a "household", it should be understood that any equivalent environment having a plurality of appliances, circuit breakers, and a control panel may also benefit from the method and system described herein.

BRIEF DESCRIPTION OF THE DRAWINGS

Further features and advantages of the present invention will become apparent from the following detailed description, taken in combination with the appended drawings, in which:

FIG. 5b is a schematic of an exemplary embodiment of the low-precision sensor from FIG. 5a;

It will be noted that throughout the appended drawings, like features are identified by like reference numerals.

DETAILED DESCRIPTION

Figure 1:
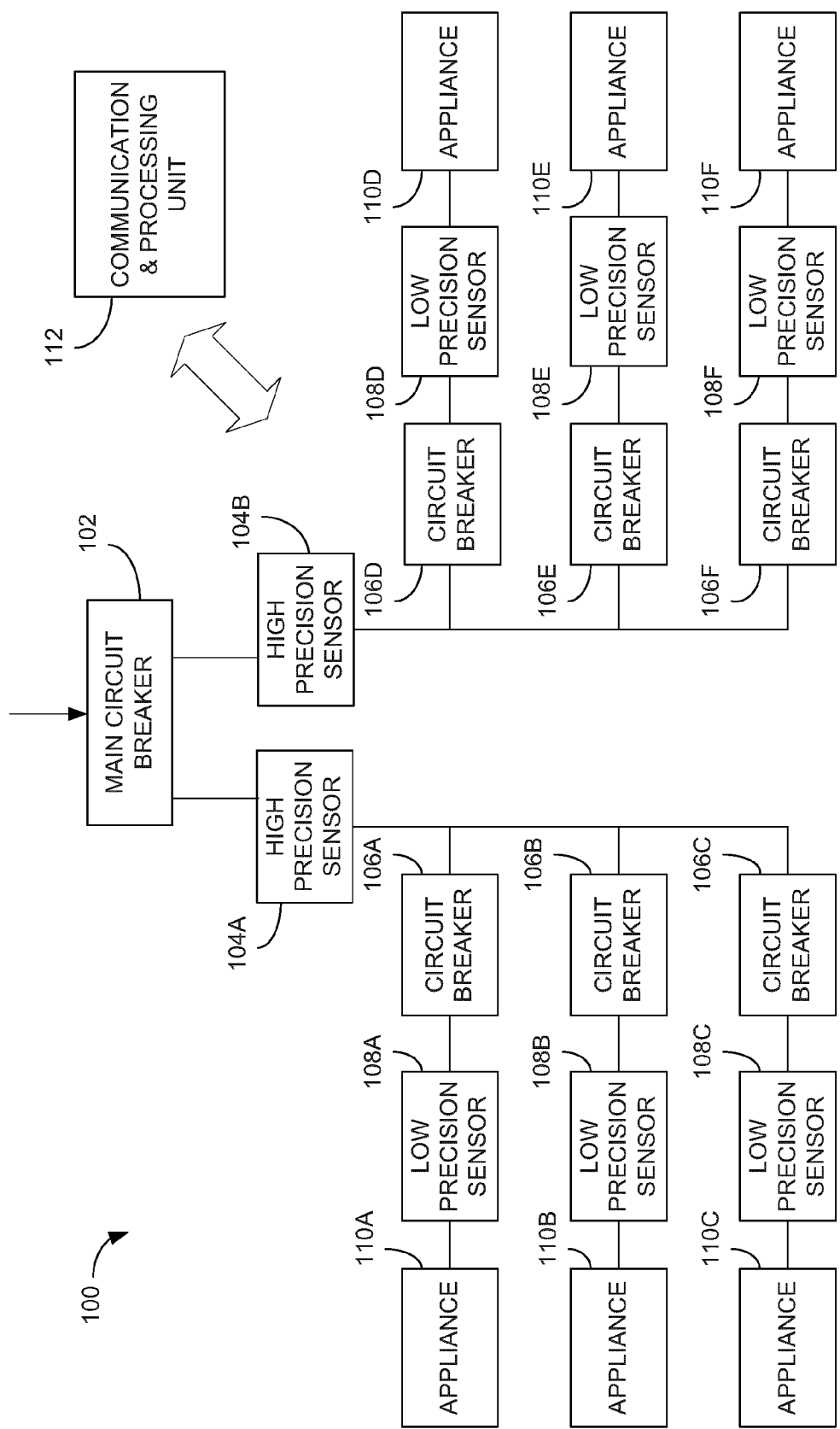
FIG. 1 is a block diagram of an exemplary embodiment of a system for measuring energy consumption using a combination of low precision sensors for each appliance and high precision sensors on the main line.

Referring to FIG. 1, there is illustrated a system 100 for measuring energy consumption of electrical appliances 110a, 110b, 110c, 110d, 110e, 110f (collectively referred to as 110 hereinafter). A main circuit breaker 102 is connected to a first high precision sensor 104a and a second high precision sensor 104b. The high precision sensors 104a, 104b may be any known current sensors providing readings of sufficient precision that they do not require additional calibration and/or correction, such as transformer-based sensors, resistor-based sensors, fiber optic-based sensors, and Rogowski coil-based sensors. The high precision sensors 104a, 104b may be provided directly in the electrical distribution panel board of a residence, between the main circuit breaker 102 and a series of individual circuit breakers 106a, 106b, 106c, 106d, 106e, 106f (collectively referred to as 106 hereinafter). A low precision sensor 108a, 108b, 108c, 108d, 108e, 108f (collectively referred to as 108 hereinafter) is connected between each one of the individual circuit breakers 106 and the appliances 110.

The low precision sensors 108 may be attached directly onto an electrical cable or wire, as will be described in more detail below. The current flowing through the electrical cable or wire is measured by each sensor 108 and wirelessly sent to a communication and processing unit 112. The communication and processing unit 112 may be provided outside of the electrical distribution panel board within a communication range of the sensors 108. The communication and processing unit 112 may act as a hub to collect sensor data and transmit it to another module for analysis and display. Alternatively, the communication and processing unit 112 may itself process the collected data, analyze it using appropriate algorithms, and display results for users.

In accordance with the embodiment illustrated in the system 100 of FIG. 1, the communication and processing unit 112 is adapted for receiving high precision sensor measurements representing total consumption of the residence from the high precision sensors 104a, 104b as well as low precision sensor measurements representing individual appliance consumption from the low precision sensors 108. Various auto-calibration algorithms may be used to correct the measurements obtained from the low precision sensors 108.

In a first embodiment, the auto-calibration algorithm comprises attributing the measure of the current sum to each circuit proportionally to the measure of each low precision sensor 108. For example, using:

$\dot{I}_T$: the precise measurement of the total current;
$\hat{I}_1, \hat{I}_2, \hat{I}_3$: the low precision measurements of circuit breakers 1, 2 and 3;

The improved precision measurement of the current of each sensor is:

$$\dot{I}_1 = \dot{I}_T * \hat{I}_1 (\hat{I}_1 + \hat{I}_2 + \hat{I}_3)$$

$$\dot{I}_2 = \dot{I}_T * \hat{I}_2 (\hat{I}_1 + \hat{I}_2 + \hat{I}_3)$$

$$\dot{I}_3 = \dot{I}_T * \hat{I}_3 (\hat{I}_1 + \hat{I}_2 + \hat{I}_3)$$

Using this technique, each individual low precision current measurement $\hat{I}_n$ can be calibrated to a more precise value.

In a second embodiment, the auto-calibration algorithm comprises summing waveforms provided by each sensor 108 for a given time window. Optimization techniques such as the Newton-Raphson technique, the bisection technique or the polynomial approximation technique may then be used to minimize the error, i.e. the difference between the computed sum and the precise measurement provided by sensors 104a, 104b, by adjusting a multiplicative gain for each signal provided by sensors 108. For example, using:

$i_T(t)$: the precise measurement of the total current;
$\hat{I}_1(t), \hat{I}_2(t), \hat{I}_3(t)$: the low precision measurements of circuit breakers 1, 2 and 3;

The following expression is computed:

$$e = \dot{I}_T(t) - (G_1 * \hat{I}_1(t) + G_2 * \hat{I}_2(t) + G_3 * \hat{I}_3(t))$$

The parameter "e" may be minimized by adjusting $G_1$, $G_2$ and $G_3$ using various optimization techniques. After convergence of the optimization algorithm, the precise measurement of each circuit is obtained by multiplying the measured current $\hat{I}_n(t)$ by its respective gain $G_n$: $\dot{I}_n(t) = G_n * \hat{I}_n(t)$. These gains G may be stored in memory to speed up the optimization process on subsequent measurements, which may take place in the communication and processing unit 112, in the sensor 108, or at any other node of the system.

In a third embodiment, mathematical correlation operations may be used to isolate each signal component from the precise sum. The correlation is calculated between each current signal from sensors 108 and the precise sum of currents provided by sensors 104a, 104b. Using this technique, the precise sum of current waveforms can be broken down into constituent signals corresponding to the current waveforms provided by low precision sensors 108. These constituent signals are attributed to each circuit based on the likelihood of the waveform. The error may thus be corrected, by the communication and processing unit 112 or a further processing unit (not shown), in order to increase precision of the measurements to be used for analysis.

Other auto-calibration techniques known to those skilled in the art may be used in order to mitigate the effects of the sensitivity of the Hall effect sensors in the application as described.

Figure 2:
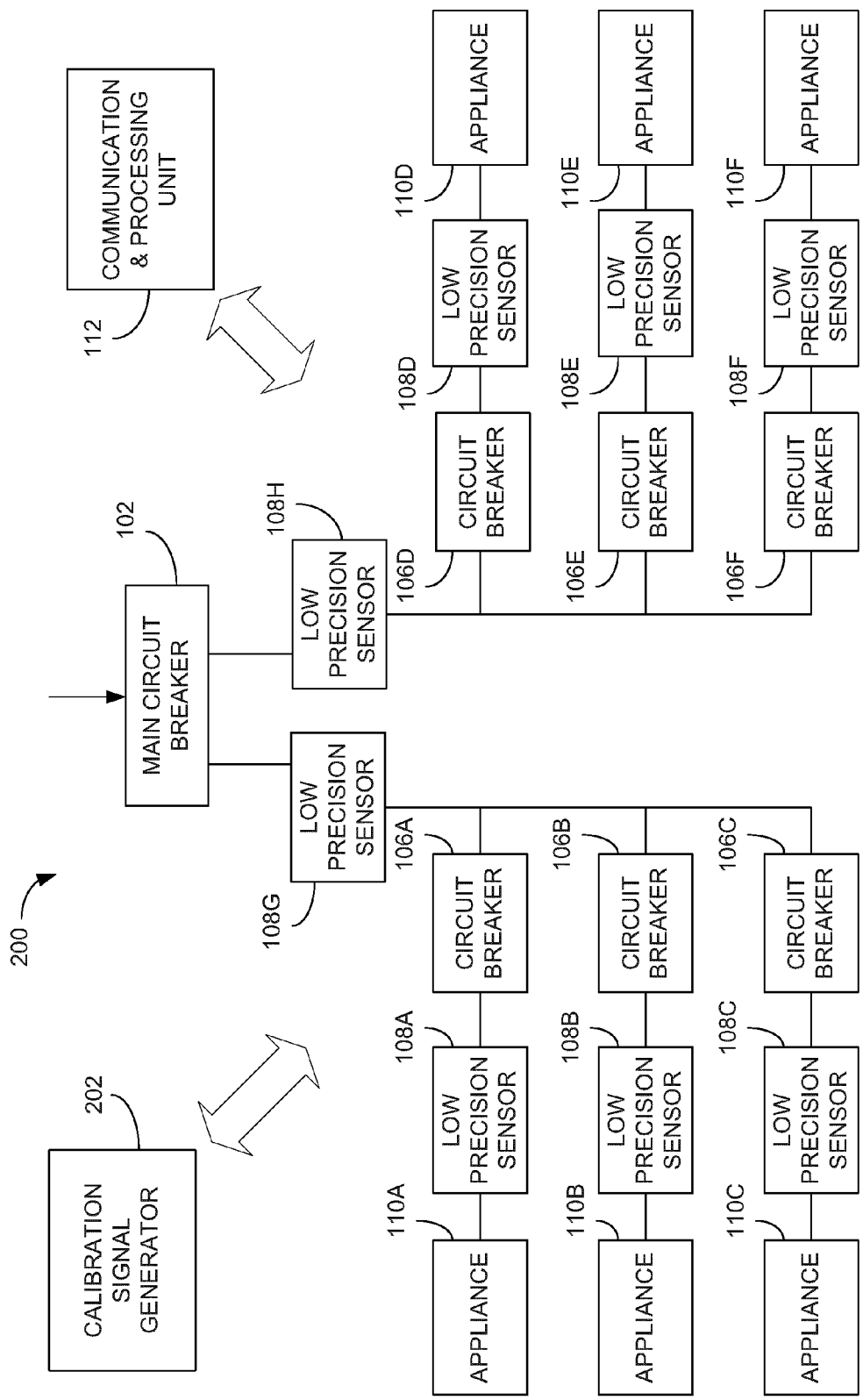
FIG. 2 is a block diagram of an exemplary embodiment of a system for measuring energy consumption using low precision sensors on the main line and on the appliances.

Referring to FIG. 2, there is illustrated an alternative embodiment for the system 100 shown in FIG. 1, whereby low precision sensors 108g, 108h are used at the output of the main circuit breaker 102 instead of high precision sensors 104a, 104b. In the system 200 of FIG. 2, the low precision sensors 108g, 108h cannot be used as a reference signal for comparison with the individual appliance consumption signals. Instead, low precision sensors 108g, 108h are calibrated once installed in the panel board. In one embodiment, calibration is performed using a calibration signal having a precisely known amplitude in order to apply a proper correction to the measurements. Calibration signal generator 202 may be used to generate the calibration signal. In one embodiment, calibration signal generator 202 comprises a resistive charge to generate a pulse of known amplitude using a switching mechanism. Other embodiments for generating a calibration signal will be readily understood by those skilled in the art.

The calibration pulse may be recognized by communication and processing unit 112 and used for correction of the low precision sensors 108h, 108g. Alternatively, the pulse may be received by the low precision sensors 108g, 108h themselves and the correction may be applied directly to the measurements before transmission to the communication and processing unit 112. Transmission techniques such as On-Off Keying (OOK), Amplitude-Shift Keying (ASK), and Frequency-Shift Keying (FSK) may be used to encode the calibration signal. The calibration signal generator 202 may also be used to remotely configure the sensors 108 in order to control the frequency of measurements and communication with the communication and processing unit 112.

Calibration signal generator 202 may be connected to any electrical outlet of the residence, or it may be provided within a transmission range of the communication and processing unit 112. Since residences in North America have two 110V lines, each one of low precision sensors 108h, 108g may be calibrated individually in order to take into account differences in position with respect to the electrical cable or wire to which it is attached. In some embodiments, the calibration signal generator 202 may be configured to generate a simple calibration signal having a single current value. Alternatively, the calibration signal generator 202 may be configured to generate a complex signal having a range of current values, for increased precision. Once low precision sensors 108h, 108g are calibrated, measured signals therefrom may then be used as reference signals to apply an auto-calibration algorithm, as per the method described for the system 100 using high precision sensors 104a, 104b.

Figure 3:
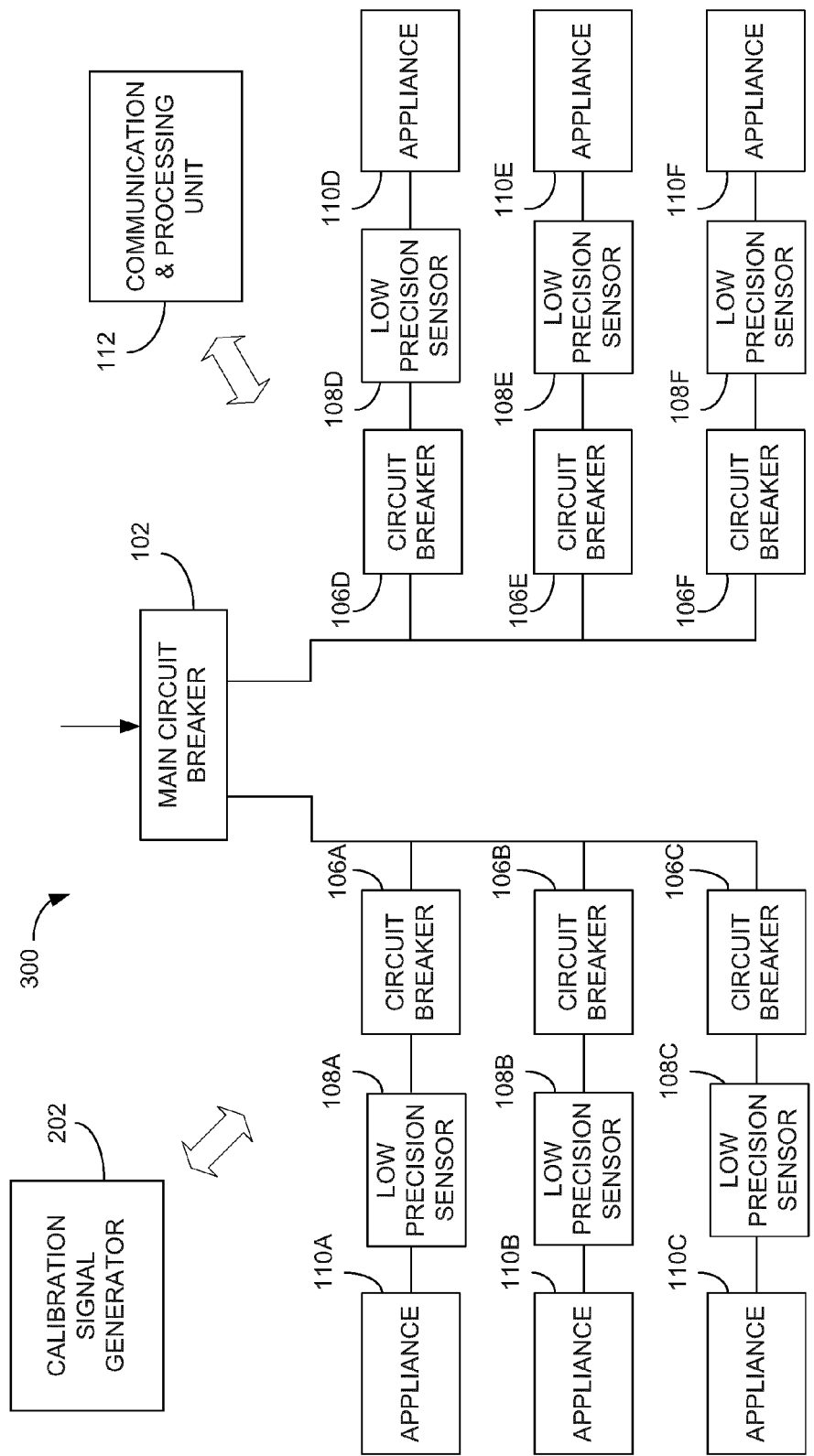
FIG. 3 is a block diagram of an exemplary embodiment of a system for measuring energy consumption using low precision sensors only on the appliances.

Referring to FIG. 3, there is illustrated another alternative embodiment, whereby only the low precision sensors 108 between the appliances 110 and the circuit breakers 106 are provided. Calibration signal generator 202 may be used to calibrate one, some, or all of the low precision sensors 108 in a manner similar to that described above with regards to low precision sensors 108h, 108g of system 200. Precision of the measurements is directly proportional to the number of low precision sensors 108 calibrated.

It should be understood that while the systems 100, 200, 300 of FIGS. 1, 2, 3 illustrate six appliances 110, six low precision sensors 108, and six circuit breakers 106, these numbers are arbitrary and purely illustrative. Electrical consumption of more and/or less appliances may be measured within a residential environment.

Figure 4:
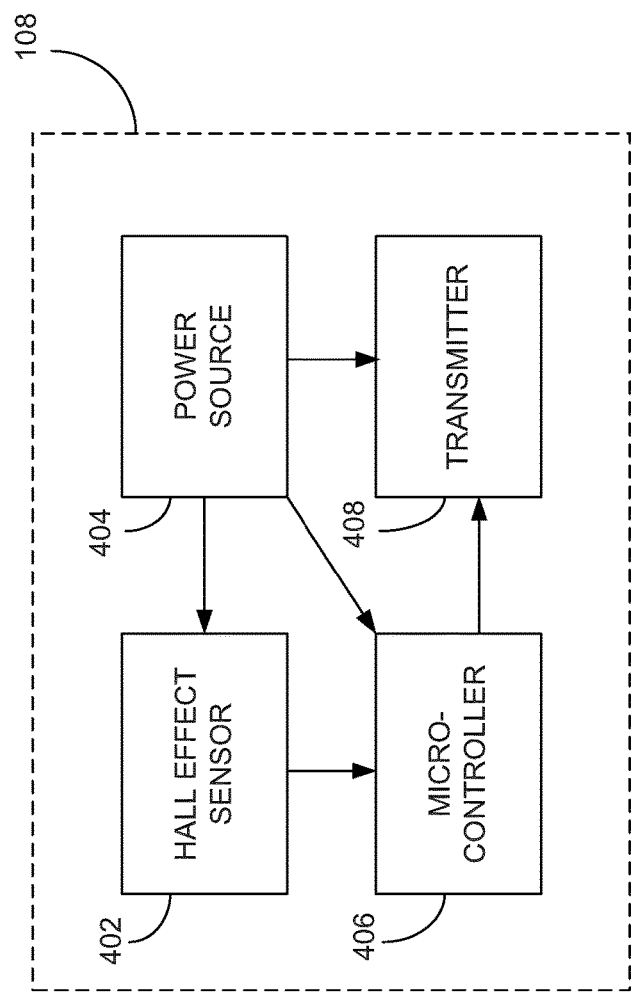
FIG. 4 is a block diagram of an exemplary embodiment for a low precision sensor.

The low precision sensors 108 may all be located inside the electrical distribution panel board. Each sensor 108 may be attached to the wire coming out of a circuit breaker 106. Each sensor 108 is linked through a wireless communication protocol to the communication and processing unit 112. In one exemplary embodiment, the IEEE 802.15.4 protocol is used due to its low energy consumption and also low cost of implementation. Other communication protocols may also be used, as will be readily understood by those skilled in the art. Referring now to FIG. 4, there is illustrated an exemplary embodiment for a low precision sensor 108. A Hall effect sensor 402 is connected between a power source 404 and a microcontroller 406. A transmitter 408 is used to wirelessly transmit measurements to the communication and processing unit 112.

The Hall effect sensor 402 generates a voltage proportional to the current it measures. An Analog-to-Digital Converter (ADC), which may or may not be integrated within the microcontroller 406, converts the sensor output voltage to a digital value. The microcontroller 406 or the communication and processing unit 112 may apply a correcting function on the digital samples to mitigate the nonlinear behavior of the Hall effect sensor 402. The coefficients of this correcting function may be found using extensive empirical data under controlled conditions. While the sensitivity of the Hall effect sensor 402 is affected by its position relative to a wire, the auto-calibration algorithms as described above may be used to mitigate this sensitivity. In an alternative embodiment to the auto-calibration algorithms, a carefully designed casing ensures a precise alignment of the sensor 108 on the monitored wire and thus provides reliable and repeatable current measurements.

Figure 5B:
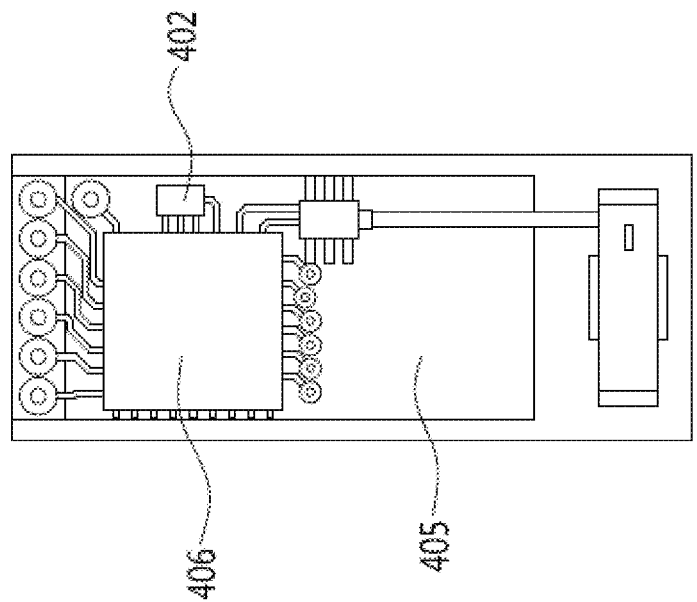
Figure 5A:
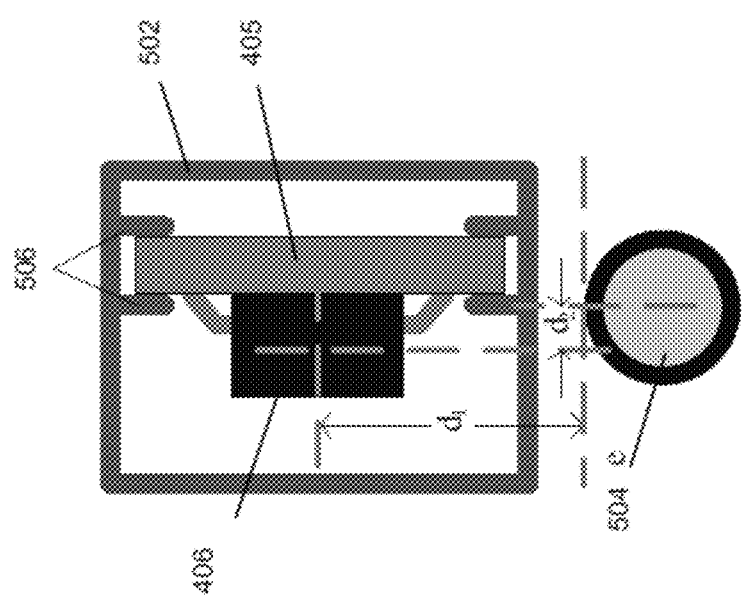
FIG. 5a is a schematic of an exemplary embodiment of a low precision sensor in a square-shaped casing positioned with respect to a cable.

FIG. 5a illustrates a side view of the sensor 108 provided within such a casing 502 and positioned with respect to a wire or cable 504. FIG. 5b is a front view of the sensor 108. The Hall effect sensor 402 is provided on an integrated circuit mounted on a printed circuit board (PCB) 405 comprising the microcontroller 406. The battery 404 and transmitter 408 are not illustrated for simplicity. Distance d1 represents a known and fixed distance from the outer surface of the wire 504 to a substantially central point along a length of the Hall effect sensor 402 integrated circuit. Distance d2 represents a known and fixed distance from a substantially central point of the wire 504 to a substantially central point along a width of the Hall effect sensor 402 integrated circuit. Distances d1 and d2 remain constant among the low precision sensors 108 due to the architecture of the casing 502. Any variation with regards to d1 and d2 may affect the precision of the sensor 108. Positioning guides 506 may be provided within the casing 502 to ensure that sensor 108 remains at a fixed and known position within the casing 506. The positioning guides 506 may be provided in a top-bottom configuration (as illustrated), a left-right configuration, a single side configuration, or any other configuration that maintains the sensor 108 in a fixed and known position. Alternatively, the casing 502 may be sized to receive the sensor 108 without allowing for movement therein. In the embodiment illustrated in FIG. 5a, the casing is square or rectangular shaped.

Figure 5D:
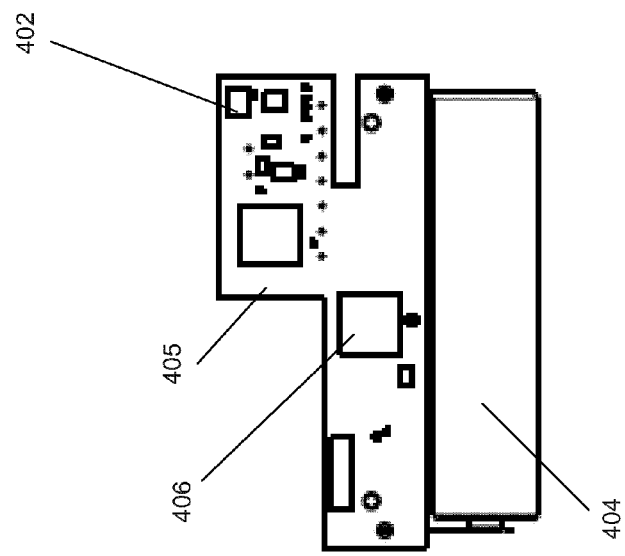
FIG. 5d is a schematic of an exemplary embodiment of the low-precision sensor from FIG. 5c.
Figure 5C:
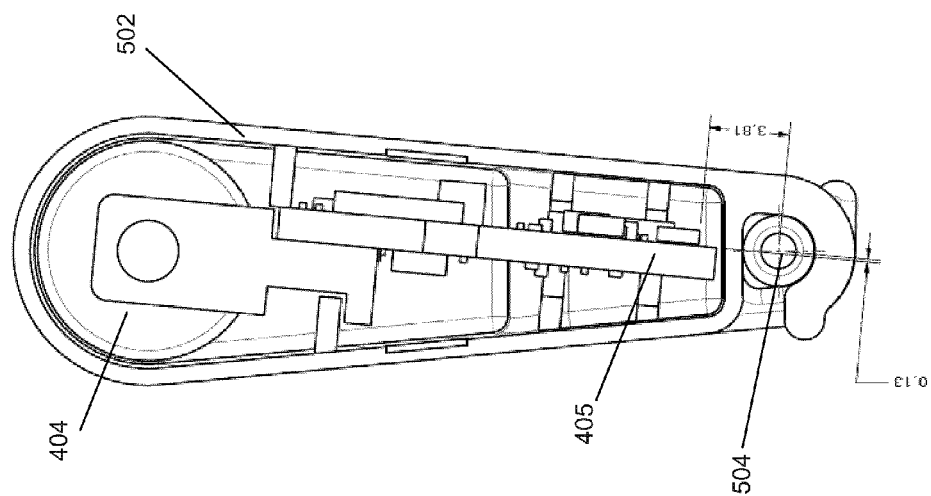
FIG. 5c is a schematic of an exemplary embodiment of a low precision sensor in a rounded and tapered casing positioned with respect to a cable.

FIG. 5c is a side view of an alternative embodiment for the sensor 108, provided within a casing 502 that is rounded and tapered from a top end to a bottom end, the bottom end attached to the wire 504. FIG. 5d is a front view of the sensor 108 in the rounded and tapered casing 502. In this embodiment, the power source 404 is a standard AAA battery held between a pair of brackets (not shown) in order to power the circuit. The PCB 504 is irregularly shaped, in this case with two cut-outs, and the microcontroller 406 and Hall Effect Sensor 402 reside thereon. The rounded and tapered casing 502 is shaped at its top end to mate with the AAA battery acting as the power source 404 while the bottom end is narrower to securely hold the PCB 405 in place. Other alternatives for the casing 502, the power source 404, and the PCB 405 may also be used.

Figure 6A:
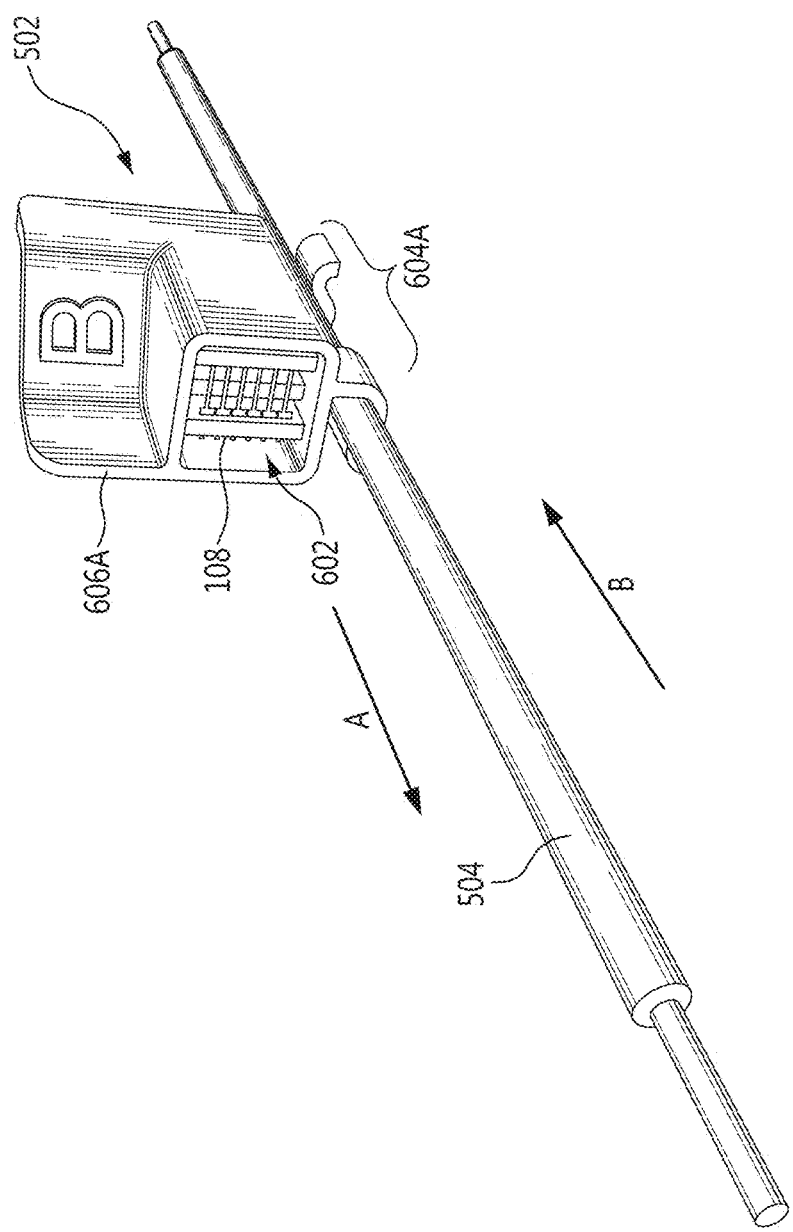
FIG. 6a illustrates an exemplary embodiment of a low precision sensor in a twist and clip type square-shaped casing attached to a cable.

FIG. 6a is an illustrative embodiment of the square or rectangular shaped casing 502 of FIG. 5a as attached to the wire 504. An opening 602 is provided to receive the sensor 108 within the casing 502. The casing 502 may surround the sensor 108 around four sides thereof, six sides thereof, or any other configuration that allows the sensor 108 to be properly retained therein and fixed at a known position while attached to the wire 504. In some embodiments, the casing may also act as a shield to block interferences generated by neighboring magnetic fields, such as those generated by currents flowing through wires nearby. This may be done by providing part or all of the casing in a shielding material, such as sheet metal, metal screens, and metal foam. Alternatively, the casing 502 may be made of plastic materials and have one or more sides coated with a metallic ink or similar material, or covered with a metallic foil such as mu-metal. Given the wireless transmission of measured signals, the casing should block interference signals generated by magnetic fields without blocking transmission of the measured signals to the communication and processing unit 112. This may be done by leaving at least one surface of the casing adjacent to an antenna un-shielded, or by having the antenna outside of the casing. A non-shielding casing may be made of plastic, wood, metals, alloys, composite materials, and any other suitable material. Fabrication techniques for the casing 502 include but are not limited to rapid prototyping, molding (blow, compressing, extrusion, foam, injection, etc) and others known to those skilled in the art.

In the embodiment illustrated, the opening 602 of the casing 502 is designed to receive the sensor 108 such that the Hall effect sensor 402 integrated circuit is aligned with a direction of flow of the current through the wire 504. In some embodiments, the opening 602 may be covered with an end piece (not shown) held in place using any one of pressure, glue, screws, or any other known attachment techniques. The alignment of the Hall effect sensor 402 integrated circuit with respect to the wire 504 should also be fixed and known. Repeated alignment is enabled using an attachment member 604a such as a twist and clip mechanism, as shown in FIG. 6a. An attachment guide 606a is shaped to facilitate manual rotation of the casing 502 on the wire 504 such that the casing 502 ends up in a same aligned position each time it is attached to the wire 504. The opening 602 of the casing 502 may be provided facing a first direction A or a second direction B. In some embodiments, both ends of the casing 502 may be opened while the sensor 108 is retained within the opening 602 using positioning guides 506 and/or friction.

Figure 6B:
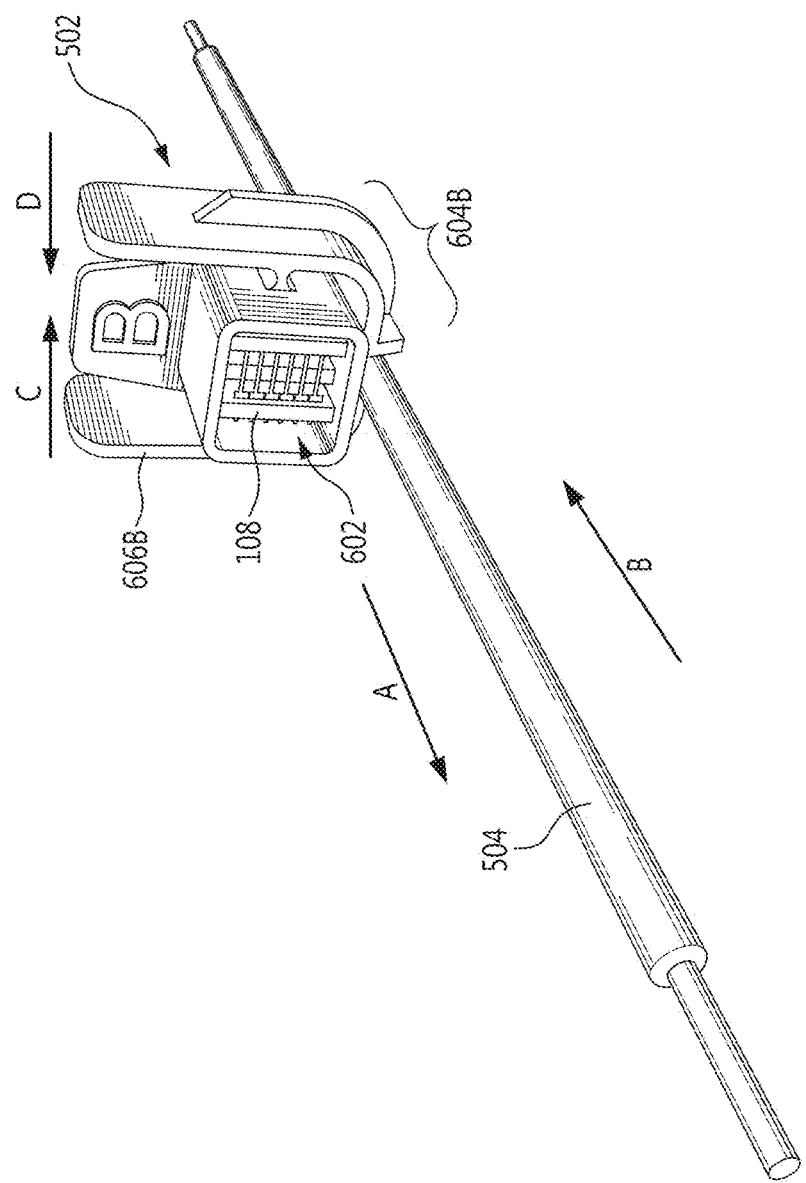
FIG. 6b illustrates an exemplary embodiment of a low precision sensor in a snap-on type square-shaped casing attached to a cable.

FIG. 6b illustrates an alternative embodiment for the square or rectangular shaped casing 502. The attachment member 604b comprise a clipping mechanism controlled by the attachment guide 606b. The attachment guide 606b is flexible along directions C and D perpendicular to directions A and B to allow engaging and disengaging of the attachment member 604b to the wire 504.

Figure 6C:
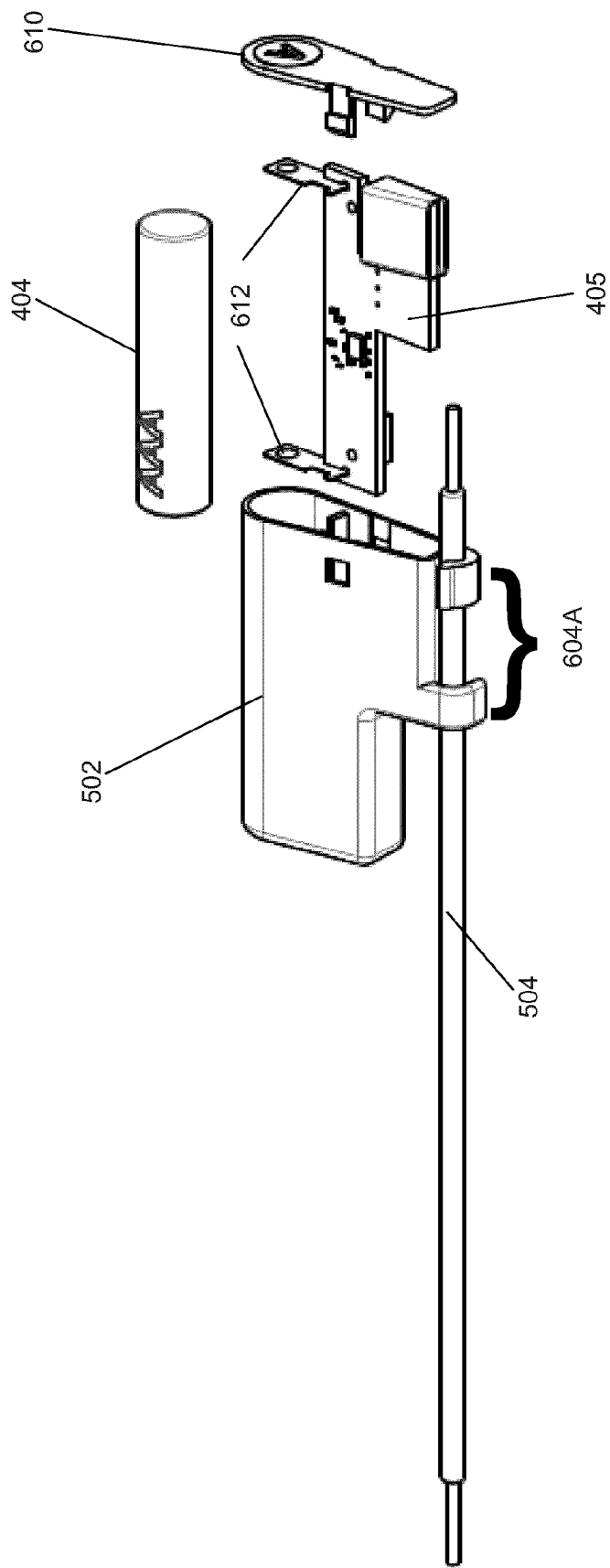
FIG. 6c illustrates an exemplary embodiment of a low precision sensor outside of a twist and clip type rounded and tapered casing attached to a cable.

FIG. 6c illustrates the rounded and tapered casing 502 of FIG. 5c as attached to the wire 504. Similarly to the embodiment of FIG. 6a, the attachment member 604a is a twist and clip mechanism. A pair of brackets 612 retain the power source 404 and provide contact with the circuit on the PCB 405 while an end piece 610 may be used to close the opening 602 of the casing 502.

Figure 7:
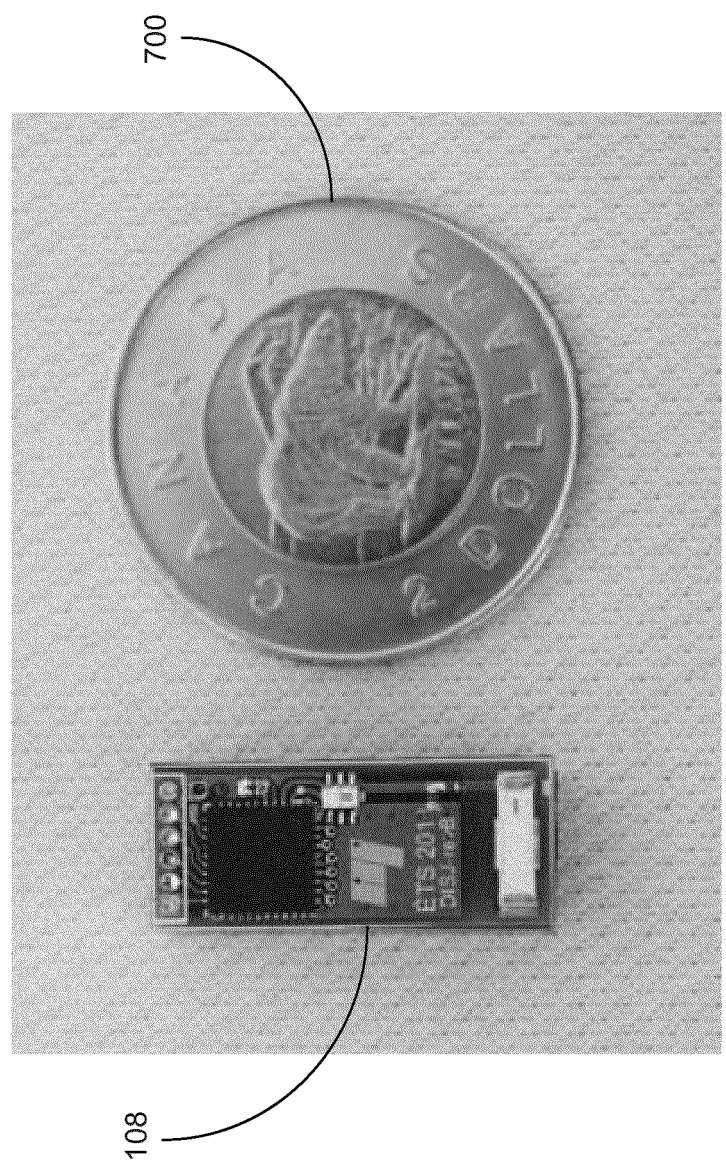
FIG. 7 comparatively illustrates an exemplary size for the low precision sensor.

Referring now to FIG. 7, there is illustrated a top view of an exemplary low precision sensor 108 as compared to the size of a Canadian Looney (two dollars). In the embodiment illustrated, the sensor 108 is made of three printed circuit boards (PCB). The dimension of each PCB is 24 mm×10 mm. Assembled, they form a block of 24 mm×10 mm×15 mm. A sensor 108 of this size easily fits inside the electrical distribution panel board of a residence. It should be understood however that these dimensions are illustrative only and may vary. For example, advances in micro-electronics may allow sensors of 1 mm$^3$ to be fabricated. The size of the sensor 108 is limited by the physical limitations of the technology at the lower end of the size spectrum, and by the space available inside the electrical distribution panel board at the higher end of the size spectrum.

In order to extend the battery life of the sensors 108, the circuit may be designed to take measurements every K seconds. Additionally, the measured data may be stored in memory and transmitted every L measurement. For example, a single measurement may be taken by sampling the input waveform 20 times during a 60 Hz cycle. This over sampling ratio was found to be a good compromise between accuracy and the power consumption of the sensor. Other ratios may be used, as will be readily understood by those skilled in the art.

Figure 8:
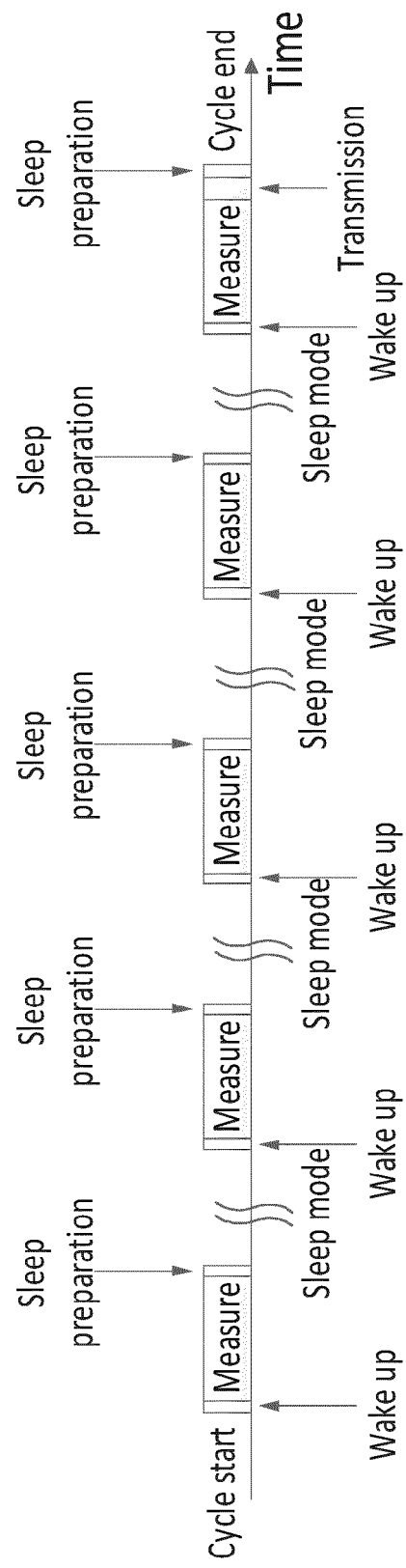
FIG. 8 illustrates an exemplary measurement cycle for the low precision sensor.

Some of the relevant information to the user is the real power of a given circuit, based on RMS values of the flowing current in a circuit. In order to reduce the energy consumption related to the transmission of the sampled data, the samples may be squared and summed prior to transmission. FIG. 8 shows an exemplary measurement cycle, whereby the circuit is activated only when a measurement is to be taken, and subsequently set to sleep mode until the next measurement. The square root of the sum and the division, which are also required to obtain the RMS value of the current, may be performed in the communication and processing unit 112 due to their higher complexity.

In some embodiments, the voltage of the system is also measured in order to provide power factor information to the user. Note that these embodiments increase the complexity of the design. In embodiments without voltage measurements, the power factor is neglected and thus considered to be 1.

Figure 9:
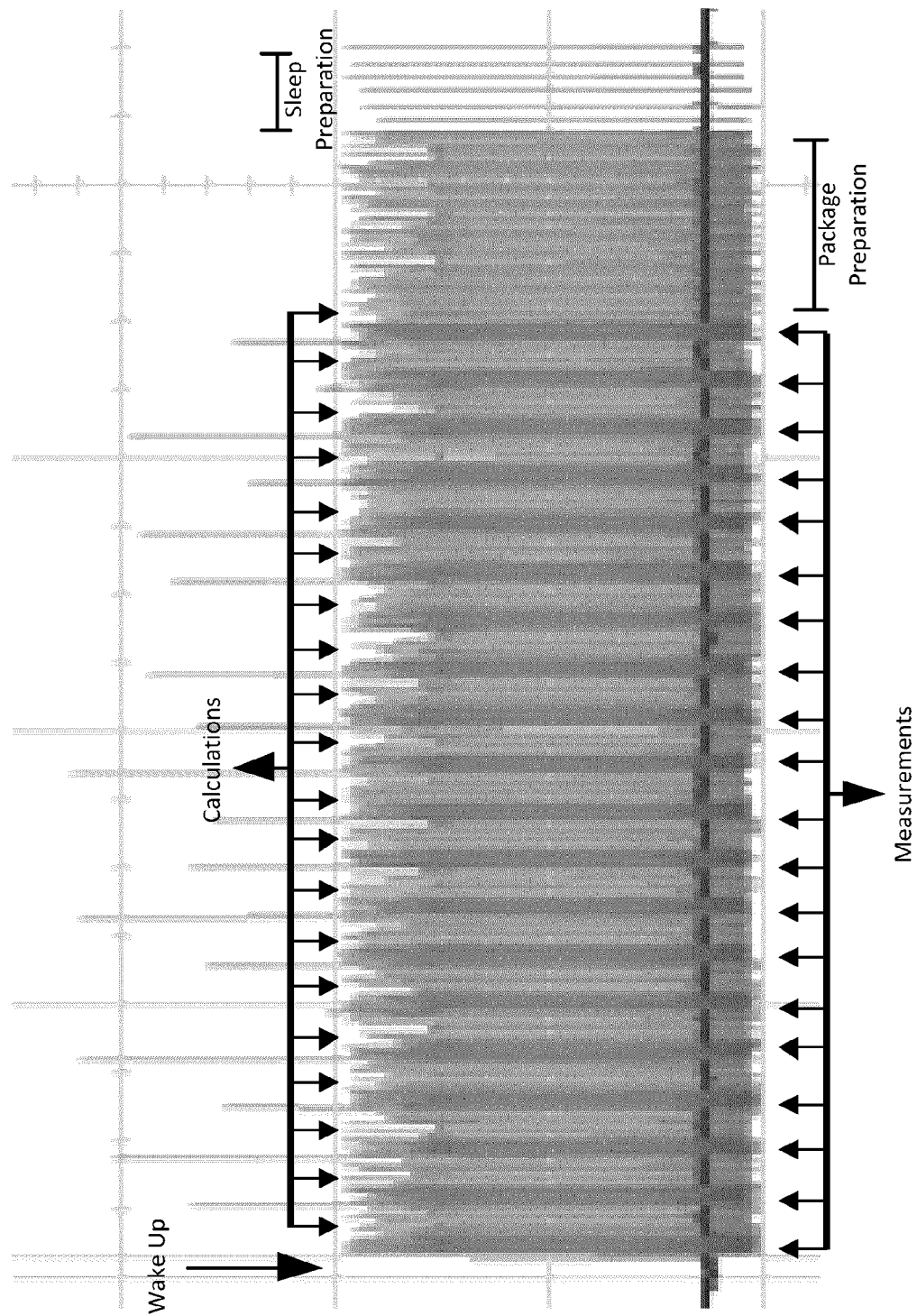
FIG. 9 illustrates an exemplary waveform of the current flowing out of the low precision sensor's battery during a measurement phase.

The low precision sensors 108 were tested for functionality, range and accuracy in a laboratory environment. A controllable current source generated a 60 Hz signal flowing through a circuit breaker. The sensor 108 was attached to the wire connected to the circuit breaker. An oscilloscope monitored the current flowing out of the sensor's battery 404. The waveform of the current during the measurement phase is shown in FIG. 9. The process started by waking up the microcontroller 406. Next, 20 samples were taken as described above. Each measure was done in two steps. First, the Hall effect sensor 402 sampled in waveform. Then, the microcontroller 406 calculated the square of that measure and added it to the sum stored in memory. After the 20 samples were completed, the microcontroller 406 prepared the data for transmission and was then put back to sleep mode. Once the sensor 108 had done L measurement phases (L=5 in this case), it transmitted the information to the communication and processing unit 112 as shown in FIG. 8.

Figure 10:
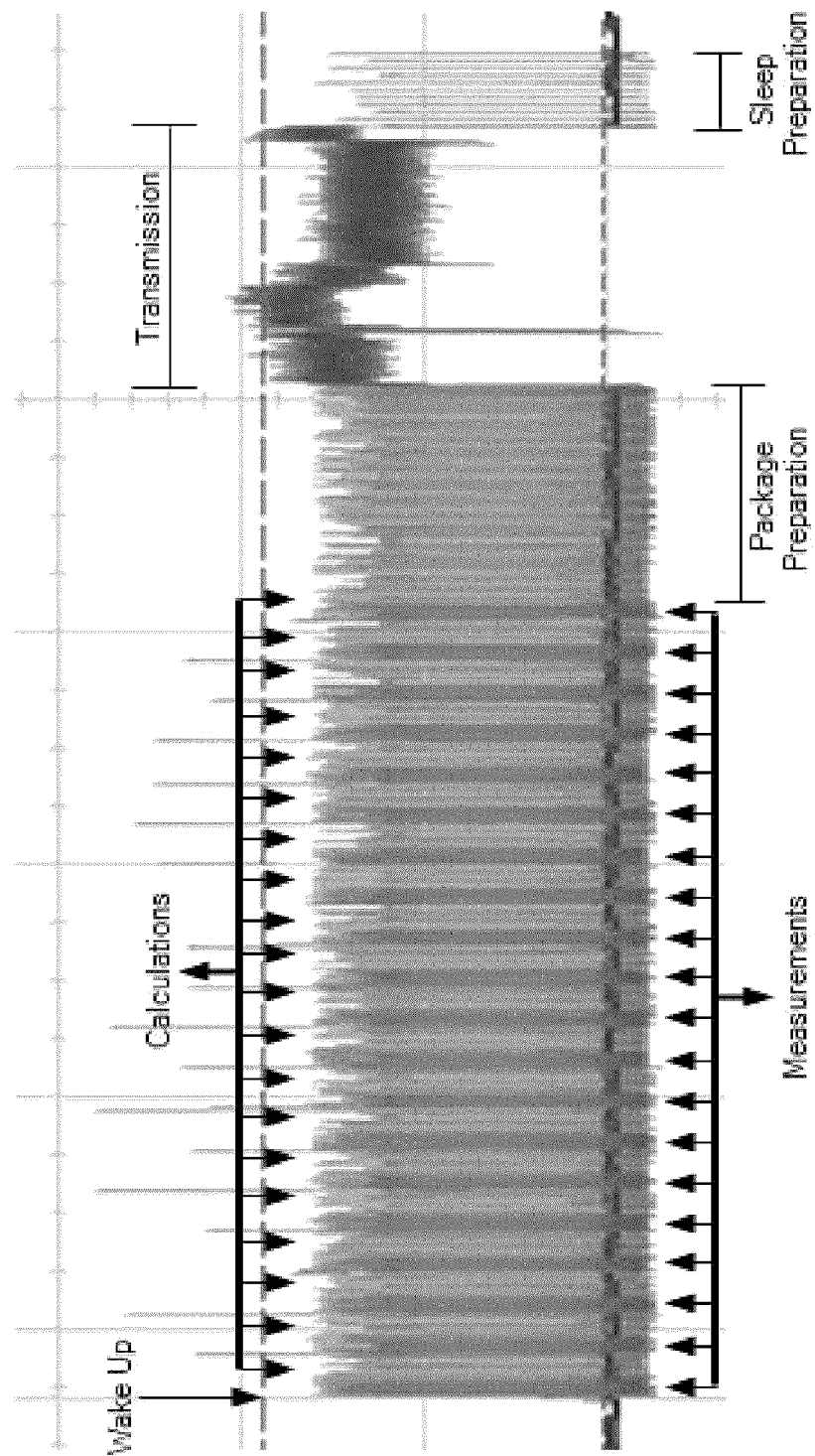
FIG. 10 illustrates an exemplary waveform of the current flowing out of the low precision sensor's battery during a transmission phase.

In FIG. 10, the $L^{th}$ measurement phase is presented along with the transmission phase showing the expected increase in battery current consumption during the transmission phase which motivated the efforts in optimizing the communication protocol, as described above with respect to FIG. 8.

Figure 11:
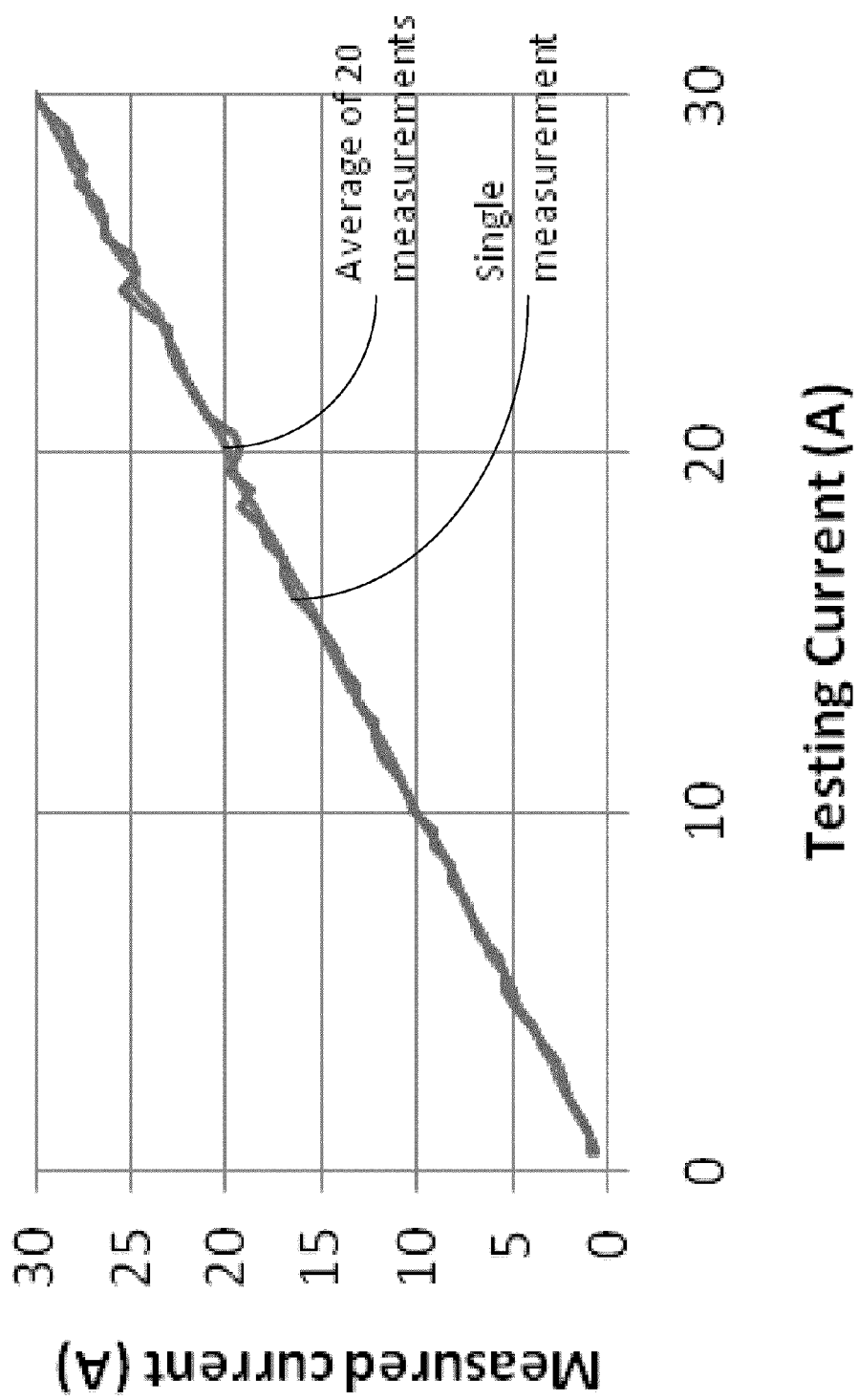
FIG. 11 illustrates an exemplary current as measured by the low precision sensor.
Figure 12:
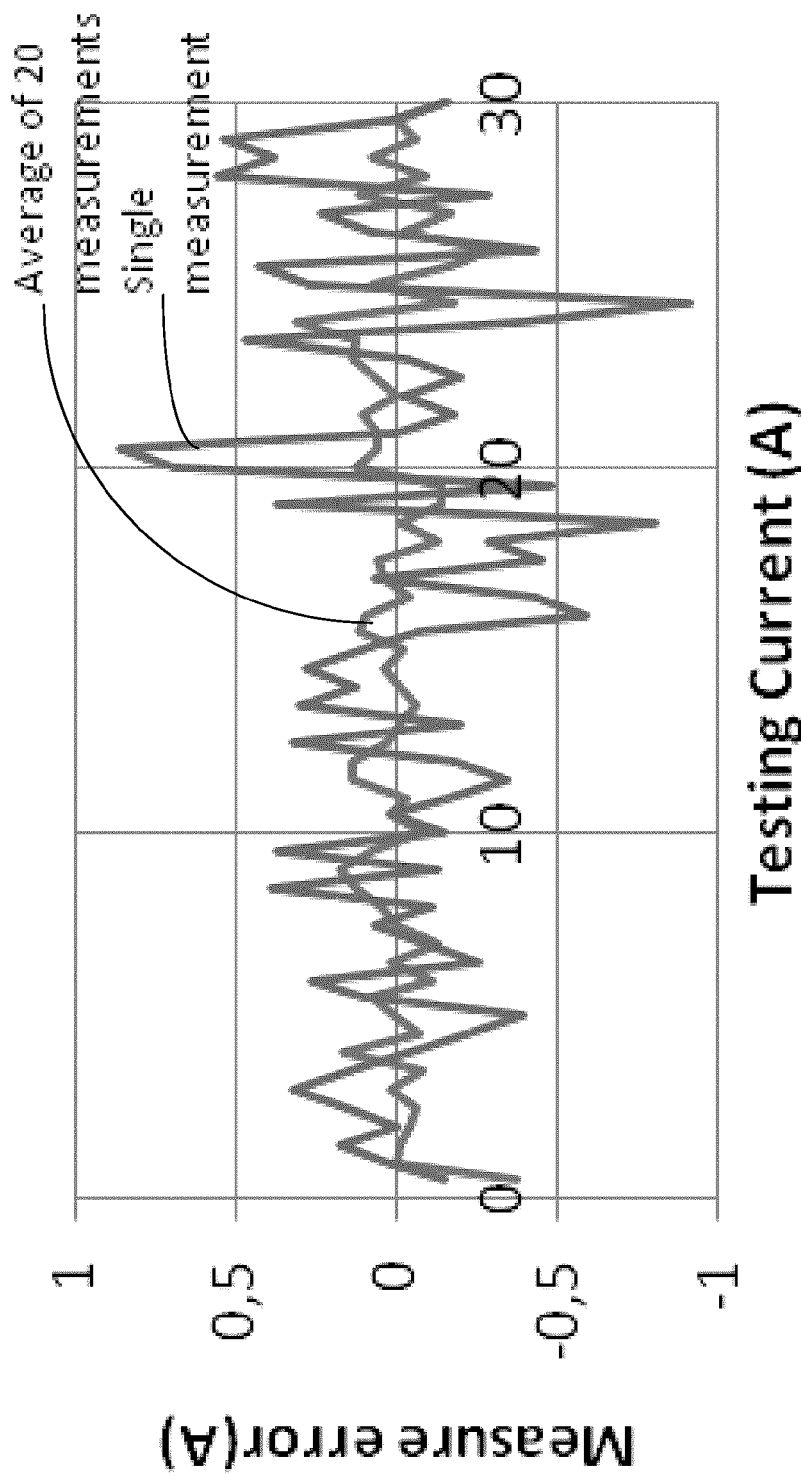
FIG. 12 illustrates an exemplary measurement error of the low precision sensor.

FIG. 11 shows the current measurements from the sensor 108 for the 0-30 A range. FIG. 12 displays the measurement error of the sensor 108. The results using averaging provide a maximum absolute error of 0.37 A on the 0-30 A range. On a 220V electrical system, this error translates to 81 W of power. Without averaging, the latency of the system is decreased and the maximum error is 0.857 A (189 W).

Many factors influence the lifetime of the battery 404 of the sensor 108. For instance, the frequency of the measurements (i.e. parameter K), the frequency of the transmissions (i.e. parameter L) and the type of batteries have a direct impact on duration. Taking a measure takes approximately 18 ms and transmitting the data takes approximately 4.3 ms. Therefore, most of the time, the sensor 108 is in sleep mode. In sleep mode, the circuit consumes 21 µA. In measure mode, it consumes 5 mA and during transmissions, it consumes 27.8 mA. These values are as measured while testing and may vary.

For a given range, the performances in terms of granularity (determined by parameter K), latency (determined by parameter L) and sensor size (determined by battery size) are in opposition. For example, one version of the sensor 108 achieves a 7-month autonomy while taking measurements every 10 seconds with a 30 seconds latency with two 150 mAh button-cell batteries. When using a AAA battery as power source, measurements may be taken three times per second with a 120 second latency and the sensor achieves an autonomy of 22.5 months.

Figure 13:
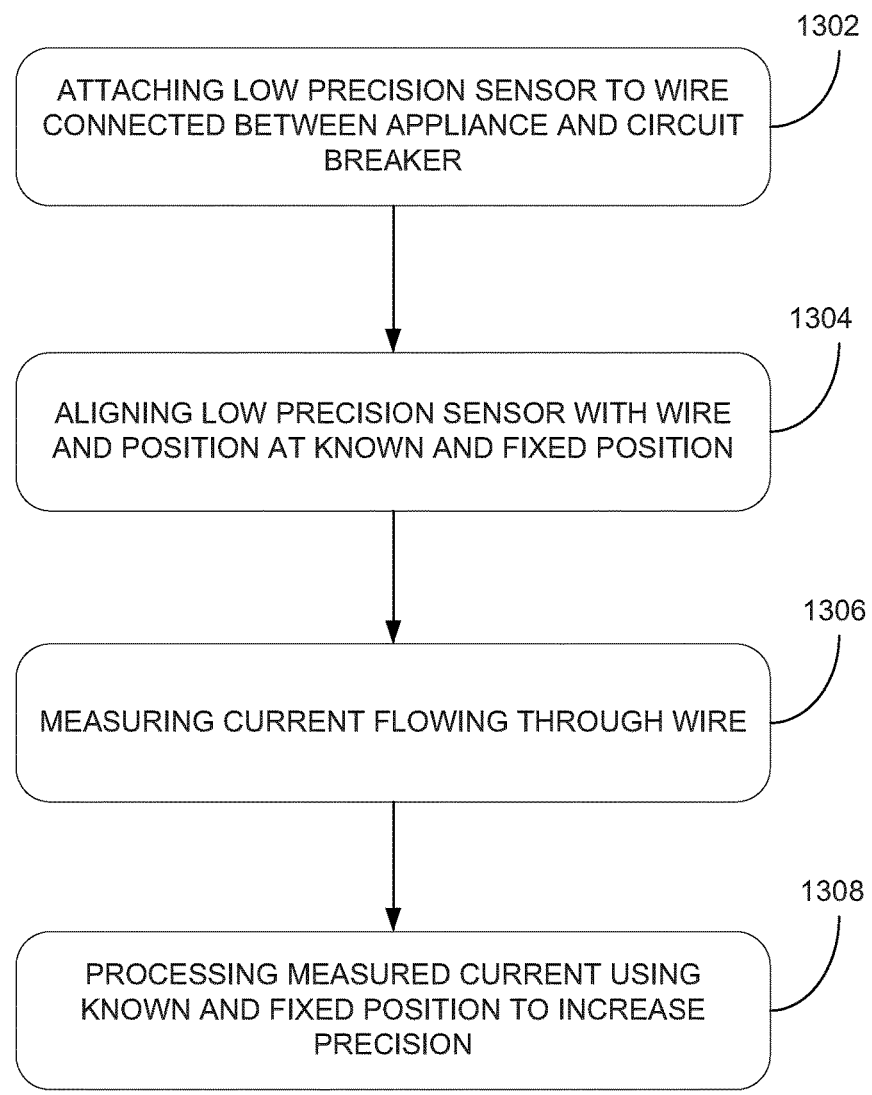
FIG. 13 is a flow chart illustrating an exemplary method for measuring electricity consumption of an individual electrical appliance.

Turning now to FIG. 13, there is illustrated a method for measuring electricity consumption of an individual electrical appliance using the system and devices as described above. In a first step 1302, the low precision sensors 108 are attached to the wire connected between the appliance and the circuit breaker inside the electrical distribution panel board. As per step 1304, the low precision sensor is aligned with the wire and positioned at a known and fixed position. Alignment may be performed manually while positioning is enabled by the known and fixed dimensions of the casing encapsulating the sensor 108. Once in place, the current flowing through the wire may be measured, as per step 1306. The measured current may be processed using the known and fixed position to increase precision of the measurement, as per step 1308. For example, in one embodiment, this processing comprises a comparison to a lookup table having a current value corresponding to a measured voltage. In an alternative embodiment, coefficients from a polynomial regression curve may be used to translate a measured voltage into current. The current values from the lookup table or from the regression curve may have been obtained for each sensor individually during a calibration process performed at the time of fabrication or post-fabrication (such as in-situ). They may also correspond to general calibration data for a similar type of sensor and a given wire gauge.

While illustrated in the block diagrams as groups of discrete components communicating with each other via distinct data signal connections, it will be understood by those skilled in the art that the present embodiments are provided by a combination of hardware and software components, with some components being implemented by a given function or operation of a hardware or software system, and many of the data paths illustrated being implemented by data communication within a computer application or operating system. The structure illustrated is thus provided for efficiency of teaching the present embodiment.

It should be noted that the present invention can be carried out as a method, can be embodied in a system, or on a computer readable medium. The embodiments of the invention described above are intended to be exemplary only. The scope of the invention is therefore intended to be limited solely by the scope of the appended claims.

The invention claimed is:

1. A system for measuring electricity consumption of an environment having a plurality of electrical appliances, the system comprising:
   a plurality of measuring devices for connection to a wire between one of the plurality of electrical appliances and one of a plurality of corresponding circuit breakers, each one of the measuring devices comprising:
      a Hall effect sensor configured to measure a current flowing through the wire; and
      a sensor support for receiving the Hall effect sensor, the sensor support comprising an attachment member configured for attaching the sensor support to the wire outside of the circuit breaker such that the wire runs through the attachment member, and the sensor support having a sensor positioning guide for fixing a position of the Hall effect sensor with respect to the wire to a known and fixed relative position;
   at least one precision sensor connectable between the plurality of corresponding circuit breakers and a main circuit breaker for the environment;
   a communication and processing unit configured to communicate with the measuring devices and configured for receiving individual consumption measurement data representative of the electricity consumption of each of the plurality of electrical appliances;
   the communication and processing unit being configured to communicate with the at least one precision sensor and being configured for receiving an overall consumption measurement data representative of the overall electricity consumption of the plurality of electrical appliances; and
   wherein the communication and processing unit is adapted to apply a calibration algorithm to the individual consumption measurement data to increase precision thereof using the overall consumption measurement data.

2. The system of claim 1, further comprising at least one additional measuring device that is connectable between the plurality of corresponding circuit breakers and a main circuit breaker for the environment, and wherein the communication and processing unit is adapted to receive overall consumption measurement data from the at least one additional measuring device.

3. The system of claim 2, further comprising a calibration signal generator for generating a calibration signal having a known amplitude for calibrating at least one of the overall consumption measurement data and the individual consumption measurement data.

4. The system of claim 1, wherein the communication and processing unit is configured to analyze the individual consumption measurement data and provide electricity consumption measurements.

5. The system of claim 1, wherein the measuring devices each further comprise an integrated circuit comprising the Hall effect sensor, a microcontroller, a power source, and a transmitter, operatively mounted to a printed circuit board.

6. The system of claim 1, wherein the support provides a first known and fixed distance from an outer surface of the wire to a substantially central point along a length of the Hall effect sensor, and a second known and fixed distance from a substantially central point of the wire to a substantially central point along a width of the Hall effect sensor.

7. The system of claim 1, wherein the support comprises an attachment guide for engaging and disengaging the attachment member to the wire.

8. The system of claim 1, wherein the calibration algorithm comprises attributing a portion of the overall consumption measurement data to each one of the plurality of electrical appliances proportionally to a corresponding measure of the individual consumption measurement data.

9. The system of claim 1, wherein the calibration algorithm comprises summing waveforms provided by each one of the measuring devices for a given time window and minimizing a difference between a computed sum and the overall consumption measurement data.

10. The system of claim 1, wherein the calibration algorithm comprises calculating a correlation between the individual consumption measurement data for each one of the plurality of electrical appliances and isolated signal components from the overall consumption measurement data.

11. The system of claim 3, wherein the calibration signal is used to calibrate the overall consumption measurement data, and calibrated overall consumption data is used to calibrate the individual consumption measurement data to increase precision thereof.

12. The system of claim 1, further comprising a calibration signal generator for generating a calibration signal having a known amplitude for calibrating the individual consumption measurement data of at least one of the plurality of measuring devices.

13. The system of claim 12, wherein the calibration signal generator is connected in an electrical outlet of the environment.

14. The system of claim 1, wherein the attachment member is adapted to partially wrap around the wire.

15. The system of claim 1, wherein the sensor support is a sensor casing for receiving the Hall effect sensor.

16. The system of claim 1, wherein the sensor support is adapted to protect the Hall effect sensor.

17. A system for measuring electricity consumption of an environment having a plurality of electrical appliances, the system comprising:
 a plurality of measuring devices for connection to a wire between one of the plurality of electrical appliances and one of a plurality of corresponding circuit breakers, each one of the measuring devices comprising
  a Hall effect sensor configured to measure a current flowing through the wire; and
  a sensor support for receiving the Hall effect sensor, the sensor support comprising an attachment member configured for attaching the sensor support to the wire outside of the circuit breaker such that the wire runs through the attachment member;
 a communication and processing unit configured to communicate with the measuring devices and configured for receiving individual consumption measurement data representative of the electricity consumption of each of the plurality of electrical appliances;
 the communication and processing unit being configured to communicate with at least one precision sensor and being configured for receiving an overall consumption measurement data representative of the overall electricity consumption of the plurality of electrical appliances; and
 wherein the communication and processing unit is adapted to apply a calibration algorithm to the individual consumption measurement data to increase precision thereof using the overall consumption measurement data.

18. The system of claim 17, wherein the at least one precision sensor is connectable between the plurality of corresponding circuit breakers and a main circuit breaker for the environment.

19. The system of claim 17, wherein the sensor support further comprises a sensor positioning guide for fixing a position of the Hall effect sensor with respect to the wire to a known and fixed relative position.

20. The system of claim 17, further comprising at least one additional measuring device that is connectable between the plurality of corresponding circuit breakers and a main circuit breaker for the environment, and wherein the communication and processing unit is adapted to receive overall consumption measurement data from the at least one additional measuring device.

21. The system of claim 20, wherein the at least one precision sensor is a low precision sensor.

22. The system of claim 17, wherein the at least one precision sensor is a high precision sensor.

* * * * *